(12) United States Patent
Takagi et al.

(10) Patent No.: US 6,486,690 B1
(45) Date of Patent: Nov. 26, 2002

(54) DEVICE UNDER TEST BOARD AND TESTING METHOD

(75) Inventors: Ryoichi Takagi, Tokyo (JP); Masahiko Hyozo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/522,014

(22) Filed: Mar. 9, 2000

(30) Foreign Application Priority Data

Nov. 5, 1999 (JP) .......................................... 11-315831

(51) Int. Cl.[7] .............................................. G01R 31/02
(52) U.S. Cl. ........................................ 324/763; 324/765
(58) Field of Search .................................. 324/754, 765, 324/757, 755, 763, 764, 347, 758, 759; 439/70, 71, 66, 82; 361/767, 769, 771, 774, 777

(56) References Cited

U.S. PATENT DOCUMENTS

| | | | | | |
|---|---|---|---|---|---|
| 5,831,441 A | * | 11/1998 | Motooka | ..................... | 324/754 |
| 6,062,873 A | * | 5/2000 | Kato | ........................... | 324/755 |
| 6,069,481 A | * | 5/2000 | Matsumura | .................. | 439/71 |
| 6,142,792 A | * | 11/2000 | Yang | ............................ | 439/70 |
| 6,181,145 B1 | * | 1/2001 | Tomita | ....................... | 324/754 |
| 6,293,808 B1 | * | 9/2001 | Ochiai | ......................... | 439/70 |

FOREIGN PATENT DOCUMENTS

JP 955273 2/1997

* cited by examiner

Primary Examiner—Michael Sherry
Assistant Examiner—Trung Nguyen
(74) Attorney, Agent, or Firm—Leydig, Voit & Mayer, Ltd.

(57) ABSTRACT

A device under test (DUT) board for testing is electrically connected to a solder ball of a package. A contactor of the board is directly attached to the solder ball. Thus, there is little influence by bouncing of a power source and ground, even when an LSI under test is operated at high speed and low voltage, and malfunctions are rare.

16 Claims, 11 Drawing Sheets

DEVICE UNDER TEST BOARD AND TESTING METHOD

BACKGROUND OF THE INVENTION

1. Field of the Invention

The present invention relates to a device under test (DUT) board and a testing method using the DUT board, in particular, a DUT board and a testing method using the DUT board applied to a high-speed LSI.

2. Discussion of Background

Along with a high speed, a large capacity and expansive functions of LSI, the trend of packaging is in a transition to a ball grid array (BGA). A device for testing is also developing into one applicable to an increased number of pins and various testing modes in conformity with a function of LSI and with a package.

Figure 18:
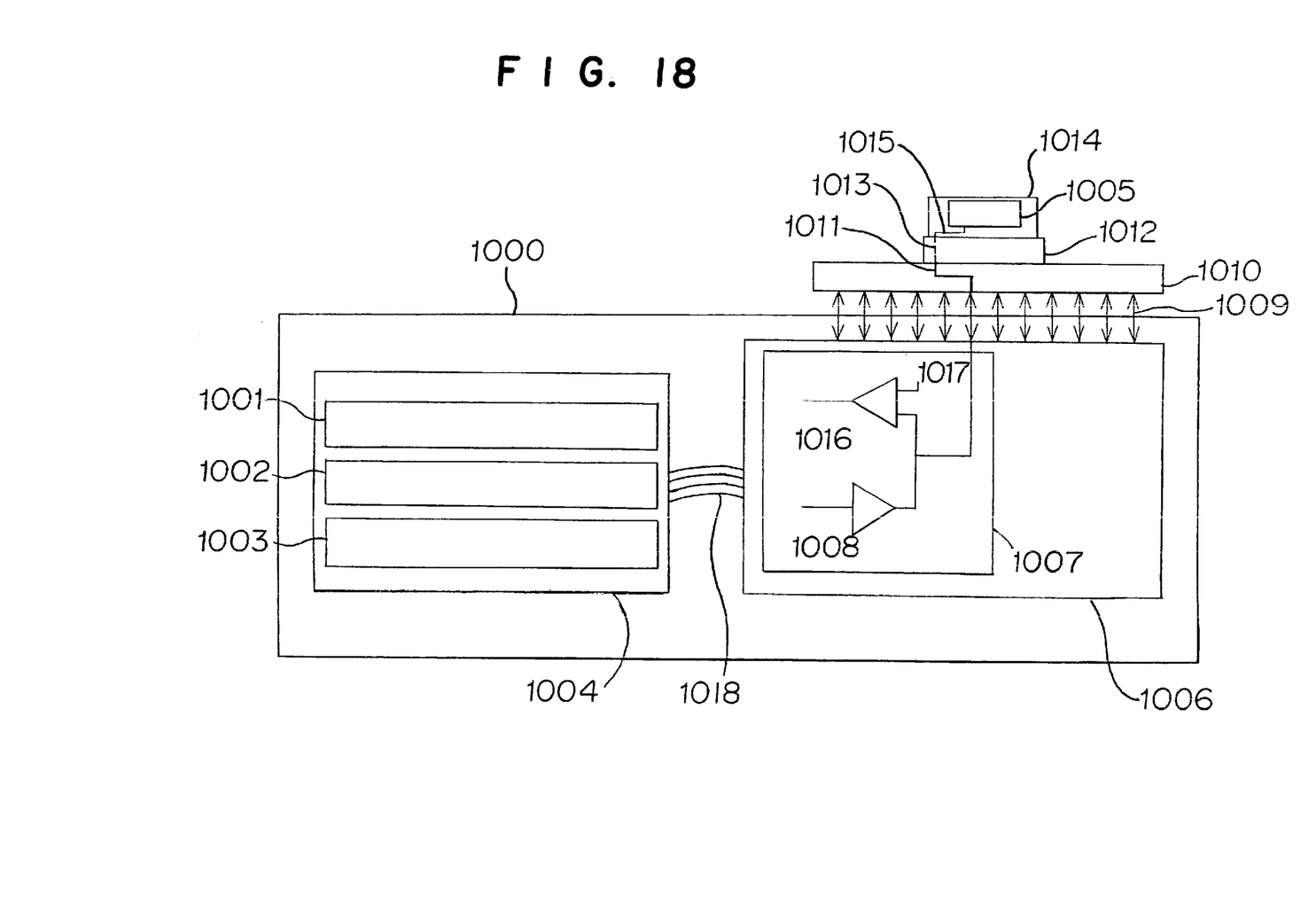
FIG. 18 illustrates a structure of a conventional testing device.

FIG. 18 illustrates a structure of a conventional testing device. In FIG. 18, numerical reference 1000 designates a device for testing (hereinafter referred to as a tester) constructed by a tester body 1004 and a test head 1006. The tester body 1004 includes a timing generator 1001 for generating a necessary timing signal as a condition for testing, a waveform formatter 1002 determining a waveform of rise and fall timing, and a unit for measuring a power source and a DC 1003 having a power source for driving a device, a DC measuring unit of the device and so on.

Further, the test head 1006 transfers a signal between an LSI under test 1005 based on a control signal obtained form the tester body 1004 through a cable 1018.

When the LSI under test 1005 is tested, a test signal is generated from a tester driver 1008 of a pin electronics 1007 accommodated in the test head 1006. The test signal is applied to the LSI under test 1005 through a POGO pin 1009, a wire 1011 of a DUT board 1010, a socket 1012, an electrode 1013 of the socket, a package 1014 and a wire 1015 of the package 1014.

Further, a reaction signal from the LSI under test 1005 is transmitted to a tester comparator 1016 of the pin electronics 1007 through a similar path to that described above. Based on a comparation with an expected value 1017 conducted in the tester comparator 1016, it is judged whether or not the LSI under test 1005 operates as designed in the tester body 1004, wherein the tester body 1004 receives a result of the comparation from the test head 1006.

Figure 19A:
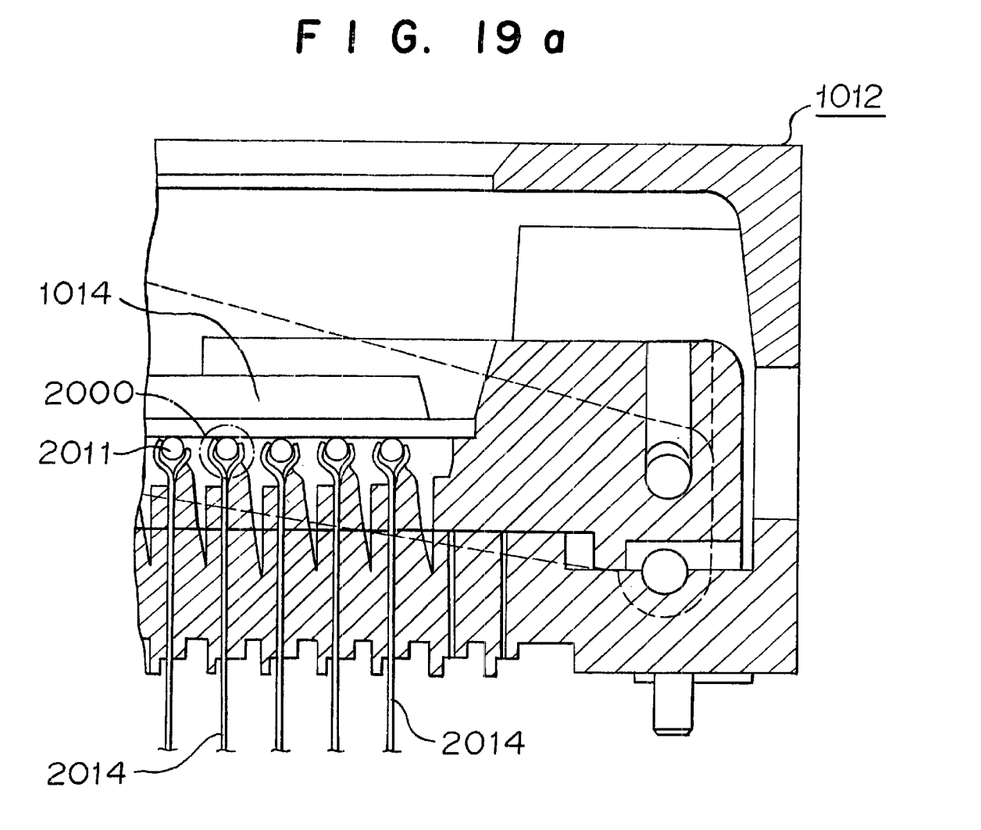
FIG. 19a is a cross-sectional view of a part of a conventional socket with an enlarged view of an electrode of a package and a contactor.
Figure 19B:
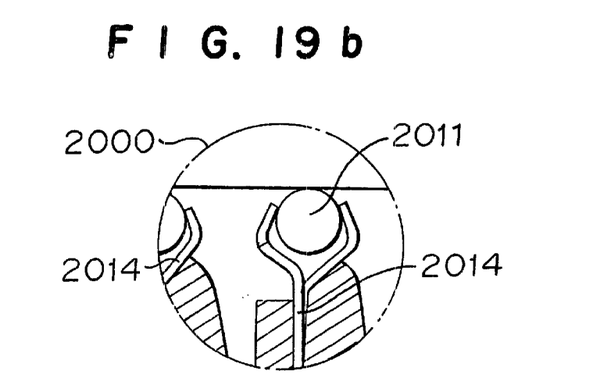
FIG. 19b is an enlarged cross-sectional view of a portion at which an electrode of a package is in contact with a contactor of the conventional socket.

FIG. 19a is a cross-sectional view of a part of a conventional socket when a package is installed in the conventional socket. The socket 1012 has a contactor 2014 for electrically connecting with the package 1014 and the DUT board 1010. FIG. 19b is an enlarged cross-sectional view of a portion 2000 in FIG. 19a, in which a solder ball 2011 is interposed in the contactor 2014.

However, in the conventional socket, the conventional DUT board, and the testing method using these, an influence of a power source and a ground bounce becomes conspicuous by an inductance L when an operation of the LSI under test 1005 is operated at a higher speed and in a lower voltage, whereby the LSI under test 1005 is efficiently operated.

Specifically, the inductance L of an electrode of the socket is 20 nH per a line. Therefore, provided that the LSI under test 1005 is operated at 1000 Mz, a gate count is 1M gates, an operating ratio of the gate is 40%, a switching time is 300 ps, and the number of electrodes of a power source is 200, a bounce on the ground side has characteristics that a consumption current of 1 MG×0.4 ×10 uA=4A and a back voltage of 20 nH/200 pin×4A/300 ps=1.3V.

Similarly, the power source of the device suffers from a similar problem. Provided that the power source is 2.5V, the voltage becomes 1.2V with a drop of the voltage of 1.3V, whereby the operation becomes deficient. Therefore, it is necessary to reduce the inductance per a pin. If the bounce is planned to restrict within 5% of the voltage of the power source, it is 2.5V×0.05=0.125V.

In case of the above example, because 1.3V occurs at 20 nH, 0.125V leads 1.92 nH. In other words, in case of the contactor of the ordinarily used socket, a length of 1 mm corresponds to about 1 nH, the length of the electrode should be about 2 mm. Accordingly, there is a problem that a function test for verifying a logic becomes defective in use of the conventional socket and the conventional DUT board.

SUMMARY OF THE INVENTION

According to a first aspect of the present invention, there is provided a DUT board electrically connected with electrodes of a package for testing comprising contactors, on which the electrodes of the package are mounted to be directly attached to the contactors.

According to a second aspect of the present invention, there is provided the DUT board according to the first aspect of the invention, wherein the contactors are a strip-like metallic plate having spring elasticity, in which a longitudinal notch is formed at a center.

According to a third aspect of the present invention, there is provided the DUT board according to the first aspect of the invention, wherein the contactor is a metallic plate having spring elasticity in which a notch in a U-like shape is provided and a part of the metallic plate is obliquely bent while maintaining a part of the metallic plate plan along the notch.

According to a fourth aspect of the present invention, there is provided the DUT board according to the third aspect of the invention, wherein the contactor is obliquely bent so as to be partly curved along a notch.

According to a fifth aspect of the present invention, there is provided the DUT board, wherein the contactor is bent while maintaining a part of the contactor plane.

According to a sixth aspect of the present invention, there is provided the DUT board according to the third aspect of the invention, wherein the contactor is obliquely bent, and in the bent portion, parallel lines or grid-lines are formed on a surface of the contactor along a notch.

According to a seventh aspect of the present invention, there is provided the DUT board, wherein the contactor is obliquely bent, and in the bent portion, a dot-like protrusion is provided on a surface thereof along a notch.

According to an eighth aspect of the present invention, there is provided the DUT board according to the first aspect of the invention, wherein the contactor is bent in a V-like shape.

According to a ninth aspect of the present invention, there is provided the DUT board according to the first aspect of the invention, a pattern is formed on a principle surface of the contactor.

According to a tenth aspect of the present invention, there is provided the DUT board according to the second aspect of the invention, further comprising a slide for opening and closing the contactor.

According to an eleventh aspect of the present invention, there is provided the DUT board according to the third through the eighth aspects of the invention, further comprising a guiding mechanism for constantly maintaining a position of the electrodes of the package, and a pushing mechanism for pressing the electrodes of the package and the contactors.

According to a twelfth aspect of the present invention, there is provided the DUT board according to the ninth aspects of the invention, further comprising a guiding mechanism for constantly maintaining a position of the electrodes of the package, a pushing mechanism for pressing the electrodes of the package and the contactors, and a conductive rubber provided between the electrodes of the package and the contactors.

According to a thirteenth aspect of the present invention, there is provided the DUT board according to the tenth through the twelfth aspects of the invention, further comprising a structure of separating and securing.

According to a fourteenth aspect of the present invention, there is provided a testing method using the DUT board according to the tenth and twelfth aspects of the invention, wherein the electrodes of the package and the contactors are freely connected and disconnected, and an inductance is reduced.

According to a fifteenth aspect of the present invention, there is provided a testing method using the DUT board according to the thirteenth aspect of the invention, wherein the DUT board is freely connected and disconnected, and an inductance is reduced.

BRIEF DESCRIPTION OF THE DRAWINGS

A more complete appreciation of the invention and many of the attendant advantages thereof will be readily obtained as the same becomes better understood by reference to the following detail description when considered in connection with the accompanying drawings, wherein.

DETAILED DESCRIPTION OF THE PREFERRED EMBODIMENT

A detailed explanation will be given of preferred embodiments of the present invention in reference to FIGS. 1 through 17 as follows, wherein the same numerical references are used for the same or similar portions and description of these portions is omitted.

Embodiment 1

Hereinbelow, Embodiment 1 of the present invention will be described.

Figure 1:
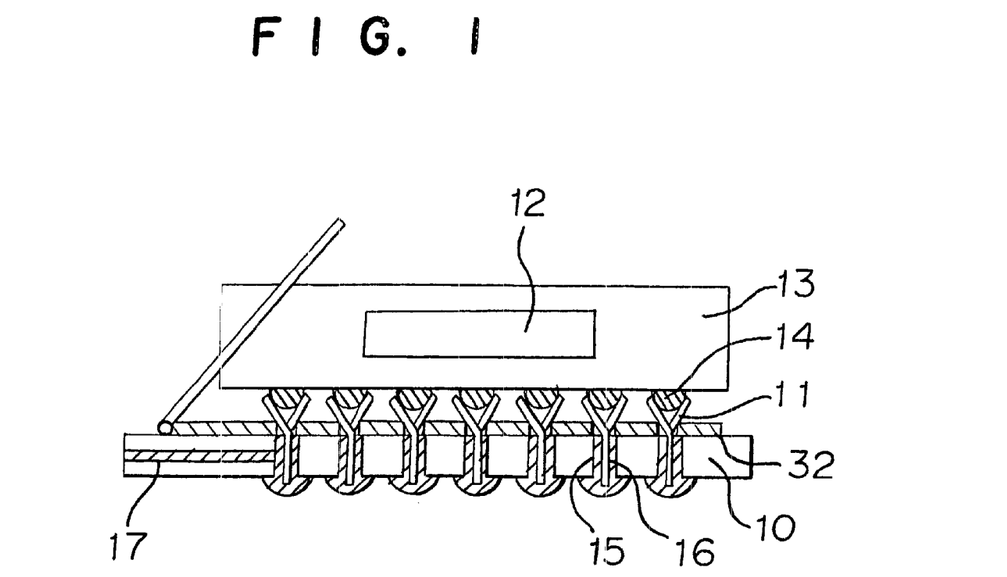
FIG. 1 is a cross-sectional view of a part of a DUT board equipped with a package according to Embodiment 1 of the present invention.

FIG. 1 is a cross-sectional view of a part of a DUT board, on which a package is mounted, according to Embodiment 1 of the present invention. In FIG. 1, a contactor 11 is provided at a position corresponding to a solder ball 14 of the package 13. Further, the contactor protrudes about 2 mm from an upper surface of the DUT board 10. The contactor 11 is embedded in a through hole 15 of the DUT board 10 and electrically connected to an inner wiring pattern 17 of the DUT board 10 by solder 16.

Figure 2:
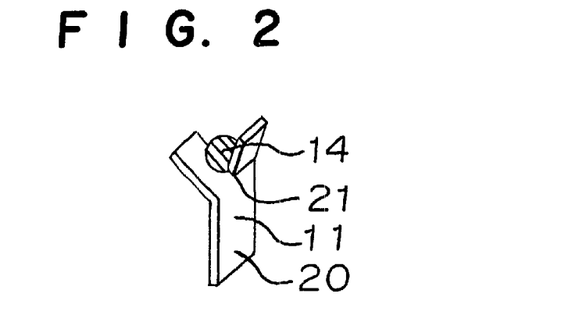
FIG. 2 is a perspective view of a contactor, on which an electrode of the package is mounted according to Embodiment 1 of the present invention.

Further, FIG. 2 illustrates a state that the electrode of the package is mounted on the contactor. In FIG. 2, the contactor 11 has a notch 21 in a longitudinal direction at approximately the center of a strip-like metallic plate 20 having spring elasticity, for example, phosphor bronze, so that the solder ball 14 is interposed in the notch 21. Only a lower portion of the opening and closing notch 21 is embedded in the through hole 15 of the DUT board 10.

Figure 3:
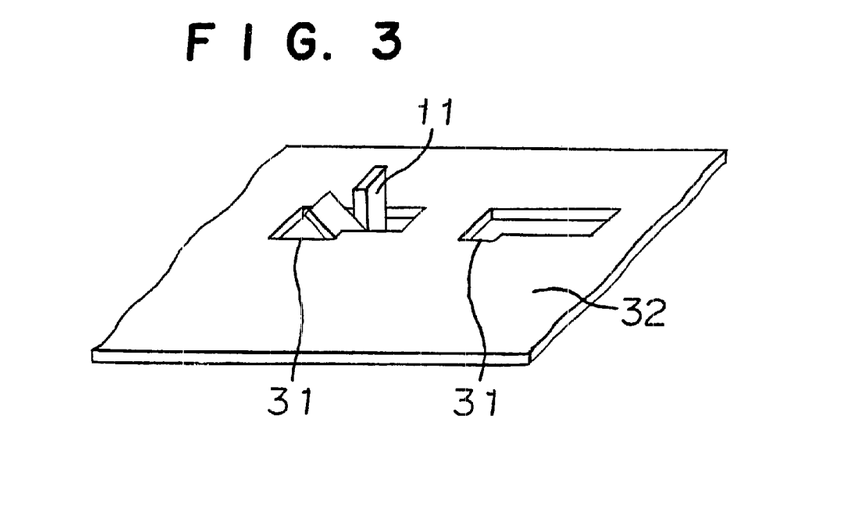
FIG. 3 is a perspective view of a part of a slide according to Embodiment 1 of the present invention.

FIG. 3 illustrates a part of a slide. A hole 31 is provided on a hard and insulative slide substrate 32, such as ceramic. The contactor 11 is inserted in the hole 31 and slid so that the contactor 11 is opened and closed.

The contactor 11 is ordinarily opened. When the substrate 32 is slid, the contactor 11 closes by its own elasticity. After the solder ball 14 of the package 13 is inserted in the contactor 11, the slide motion is canceled, and the solder ball 14 of the package 13 is interposed in the contactor 11 by returning spring elasticity.

Figure 4:
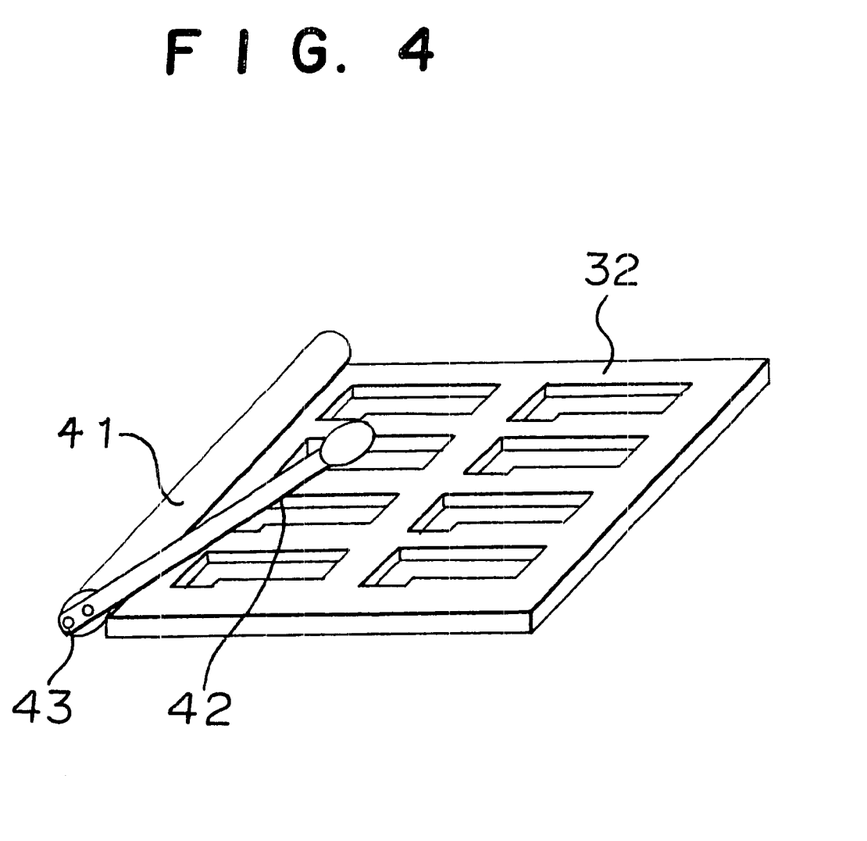
FIG. 4 is a perspective view of an entire slide according to Embodiment 1 of the present invention.

FIG. 4 is an entire view of the slide. In FIG. 4, the slide has a sliding mechanism 41 utilizing a principle of lever, wherein the slide substrate 32 is slid by pushing up the lever 42 to open the contactor. A distance between a fulcrum 43 of the lever 42 and a center of a shaft of the sliding mechanism 41 is practically about 1 mm, by which the contactor 11 can be completely opened and closed. After mounting the package 13, the lever 42 is pushed down to interpose the solder ball 14 of the package 13 the contactor 11 by the spring elasticity.

According to Embodiment 1, by directly attaching the contactor to the board, it is possible to reduce an inductance L and to reduce noise that occurs between a power source and a ground and reflection noise of a signal line, whereby an operation test of a high-speed function is realized with an excellent anti-noise property and stability.

Embodiment 2

When a contactor is directly embedded in a DUT board, an entire DUT board should be repaired or exchanged to deal with deterioration of properties of the contactor, and breakage of the contactor. Because time and cost are required, the following DUT board may be used to deal therewith.

Figure 5:
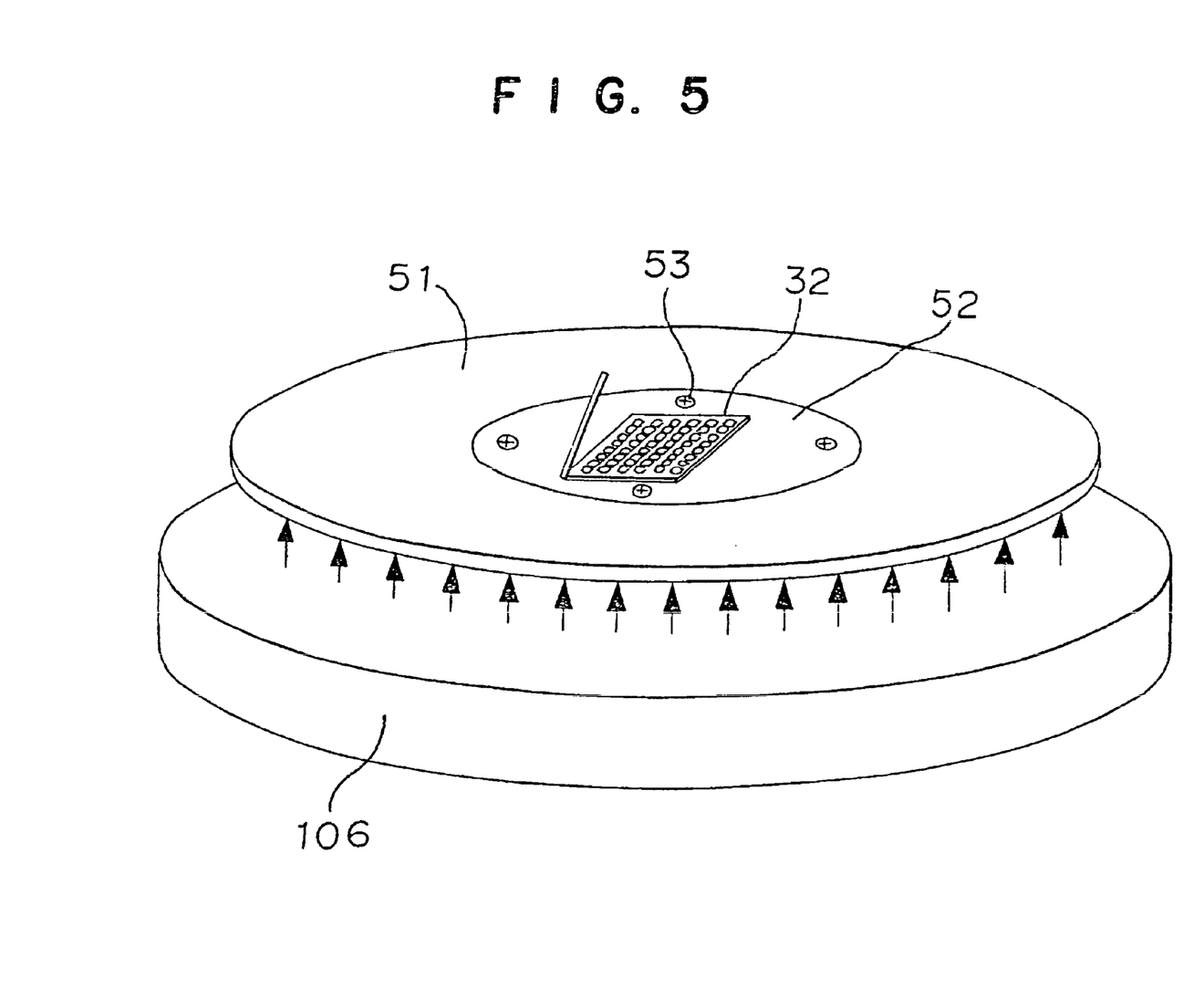
FIG. 5 schematically illustrates an entire DUT board according to Embodiment 2 of the present invention.

FIG. 5 illustrates an entire DUT board according to Embodiment 2. In FIG. 5, the DUT board 30 includes a test head 106. Further, the DUT board 30 is divided into two portions of a substrate 51 for receiving a signal (hereinbelow, referred to as a mother board) and a substrate 52 in contact with an LSI subjected to a test. In the contact substrate 52, the contactor 11 is embedded and a slide substrate 32 is provided.

Figure 6A:
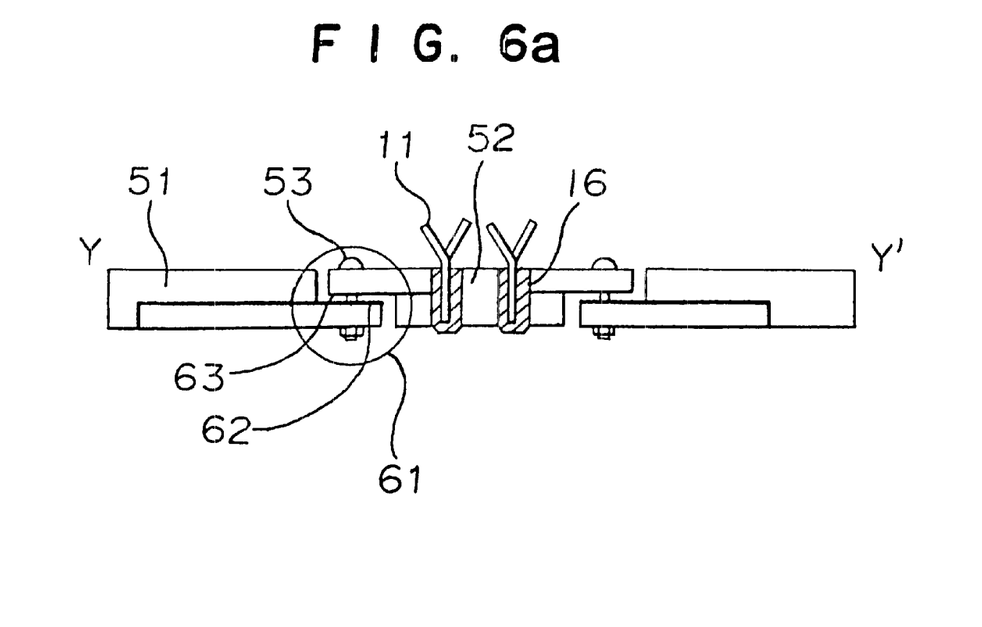
FIGS. 6a and 6b illustrate a structure of a connecting portion between a contact substrate and a mother board according to Embodiment 2 the present invention.
Figure 6B:
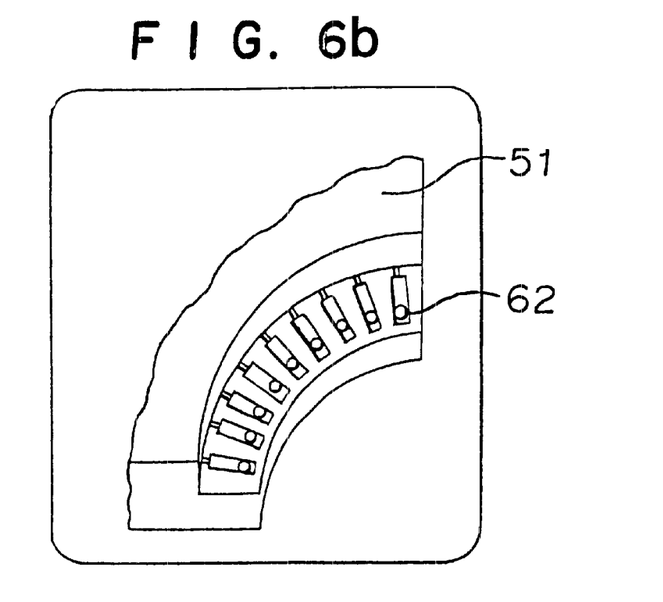

Further, FIG. 6a is a structural side view illustrating a connecting portion between the contact substrate and the mother board. In FIG. 6a, a step-like structure 61 is provided in the mother board 51 to be connected to the test head 106. A protruding electrode 62 is provided on the mother board 51. The contact substrate 52 also has a similar step-like structure, on which a protruding electrode 63 is provided. FIG. 6b is a detailed plan view of connection of the mother board 51. An electrical connection is attained by placing the protruding electrode 62 in tight contact with the protruding electrode. The contact substrate 52 and the mother board 51 are secured by a screw 53.

Figure 7:
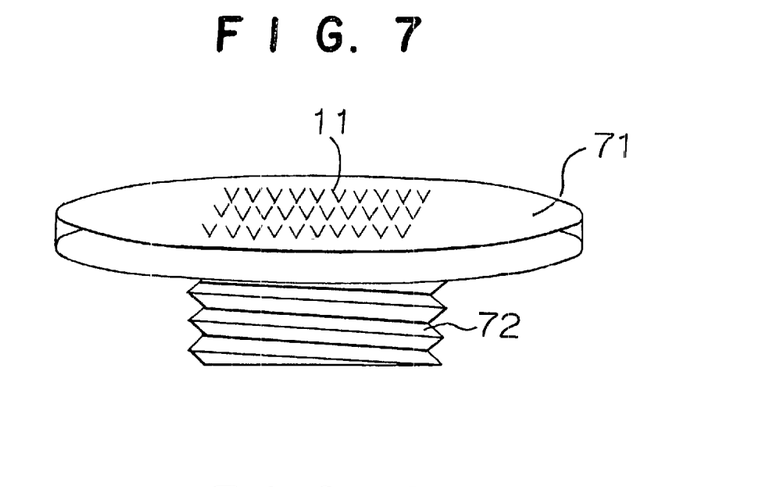
FIG. 7 schematically illustrates a structure of the contact substrate using another fixing method according to Embodiment 2 of the present invention.

Further, FIG. 7 is a structural view of the contact substrate according to other method of fixing. In FIG. 7, a thread 72 is provided in a lower portion of the contact substrate 71. A protruded electrode is provided on a bottom surface of the contact substrate 71. A contactor 11 is provided on an upper surface of the contact substrate 71.

Figure 8:
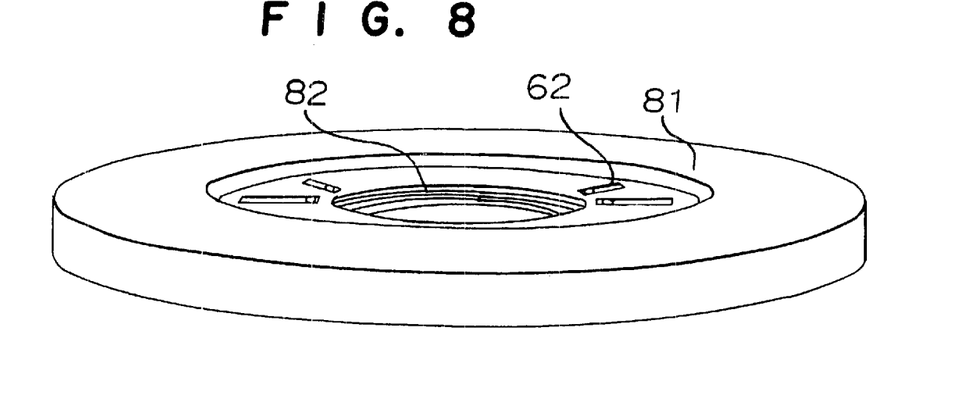
FIG. 8 schematically illustrates a structure of the mother board using another fixing method according to Embodiment 2 of the present invention.

FIG. 8 illustrates a structure of a mother board according to the other fixing method. In FIG. 8, a thread 82 is provided to screw the lower thread 72 of the contact substrate 71 at a substantially central portion of the mother board 81. A protruded electrode 62 is provided around the thread 82 at a position where the protruded electrode 62 is electrically and tightly in contact with the protruded electrode provided on a bottom surface of the contact substrate 71. A step-like structure is provided so that an upper surface of the mother board 81 is substantially in conformity with the upper surface of the contact substrate 71 when the contact substrate 71 is screwed.

For example, nickel with gilt finish is used in the protruded electrode of the contact substrate 71 and the protruded electrode 62 of the mother board 81 for improving electrical stability and a resistance to rotting.

According to Embodiment 2, by using the separable DUT board, a time and a cost for repairing and exchanging are reduced, whereby a cost for testing is reduced.

Embodiment 3

Figure 9:
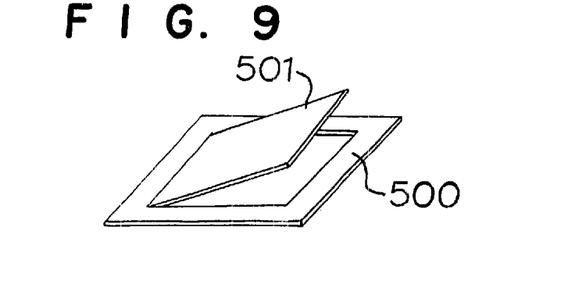
FIG. 9 is a perspective view of a contactor according to Embodiment 3 of the present invention.

FIG. 9 is a perspective view of a contactor according to Embodiment 3 of the present invention. In FIG. 9, the contactor 500 is a metallic plate having spring elasticity, in which a notch in a U-like shape is provided; and the notch is obliquely bent while maintaining a part of the notch plane along the notch. Thus, an electrode 501 as a contact portion with a solder ball is constructed.

Figure 10:
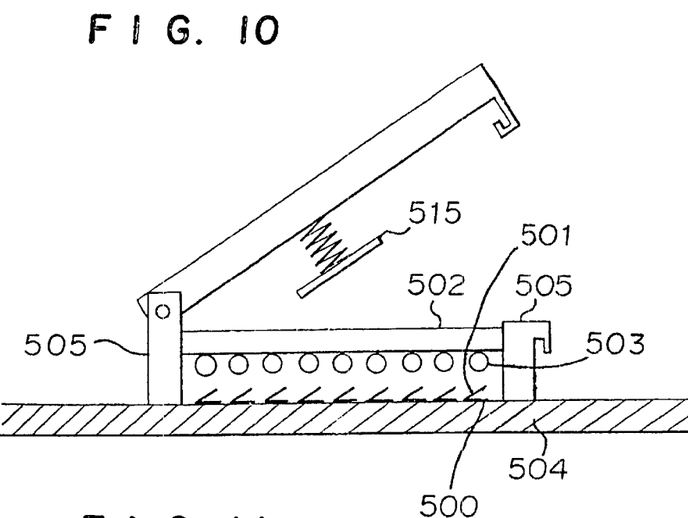
FIG. 10 is a cross-sectional view of a part of a DUT board, on which a package is mounted, according to Embodiment 3 of the present invention.

FIG. 10 is a cross-sectional view of a part of a DUT board, on which a package is mounted, according to Embodiment 3 of the present invention. In FIG. 10, the contactor 500 is installed on the DUT board at a position corresponding to the solder ball 503 of the package 502. A guiding mechanism 505 is installed for positioning the package 502 so that the solder ball 503 is sufficiently in contact with the electrode 501 of the contactor 500.

Further, the package 502 moves only in a vertical direction of the DUT board 504 along the guiding mechanism. In order to obtain an appropriate contact pressure between the solder ball 503 and the electrode 501, a pushing mechanism 515 is provided to push the package 502 toward the DUT board 504.

Figure 11:
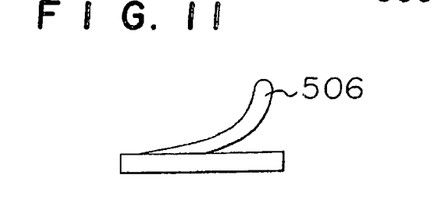
FIG. 11 is a side view of a contactor according to Embodiment 3 of the present invention.
Figure 12:
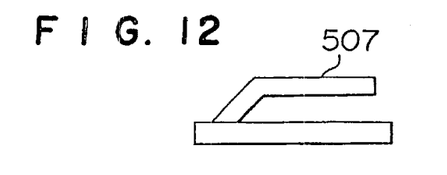
FIG. 12 is a side view of another contactor according to Embodiment 3 of the present invention.
Figure 13A:
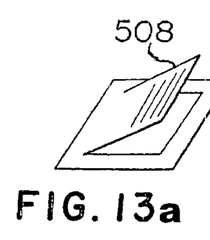
FIGS. 13a–13d are perspective views of other contactors according to Embodiment 3 of the present invention.
Figure 13B:
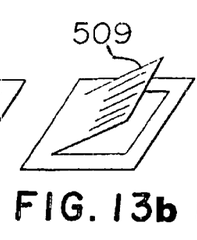
Figure 13C:
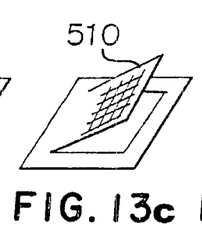
Figure 13D:
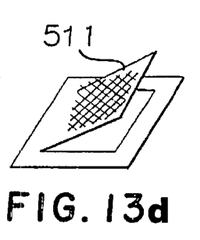

FIG. 11 is a side view of another contactor. In FIG. 11, the contactor has a feature like the contactor illustrated in FIG. 9 and has an electrode 506 curved along a solder ball. FIG. 12 is a side view of another contactor. In FIG. 12, the contactor has a feature same as the contactor illustrated in FIG. 9 and has an electrode 507 bent so as to receive force from a solder ball in a vertical direction.

FIGS. 13a–13d are perspective views of other contactors. In FIGS. 13a–13d, the contactors have a feature that is the same as the contactor illustrated in FIG. 9 and have electrodes 508 through 511 on which the surface for contacting a solder ball has parallel or grid-like lines.

Figure 14:
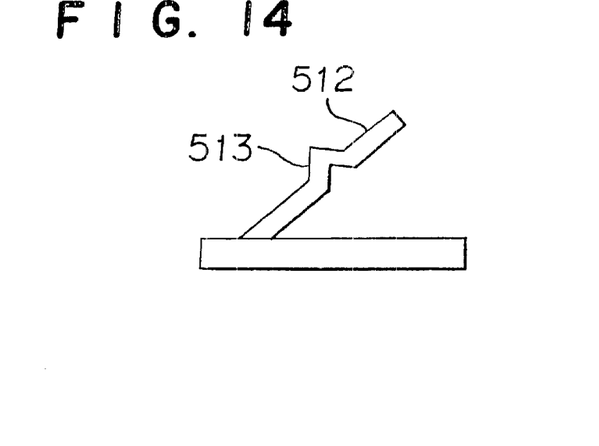
FIG. 14 is a side view of another contactor according to Embodiment 3 of the present invention.

FIG. 14 is a side view of another contactor. In FIG. 14, the contactor has a feature same as the contactor illustrated in FIG. 9 and has an electrode 512, on which surface in contact with a solder ball, a dot-like protrusion 513 is provided.

The DUT board according to Embodiment 3 has a structure enabling to separate and secure the DUT board as in Embodiment 2.

According to Embodiment 3, in comparison with Embodiment 2, it is possible to mount a further short electrode on the DUT board to reduce an inductance L. Further, a contact area between the electrode and the solder ball is increased, whereby a secure contact is obtainable even though a contact point is deviated a little.

Embodiment 4

Figure 15:
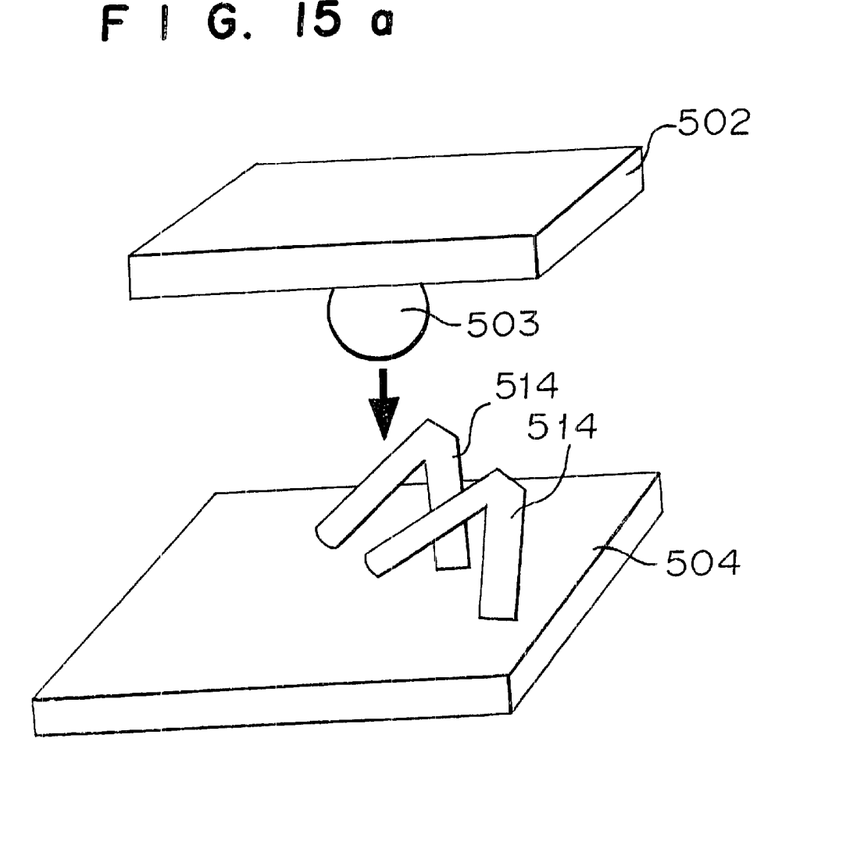
FIG. 15a schematically illustrates a state in which an electrode of a package is not in contact with a contactor according to Embodiment 4 of the present invention.
FIG. 15b schematically illustrates a state in which the electrode of the package is in contact with the contactors according to Embodiment 4 of the present invention.
FIG. 15c is a cross-sectional view taken along a line 15c—15c of FIG. 15b and viewed in a direction of an arrow.
Figure 15B:
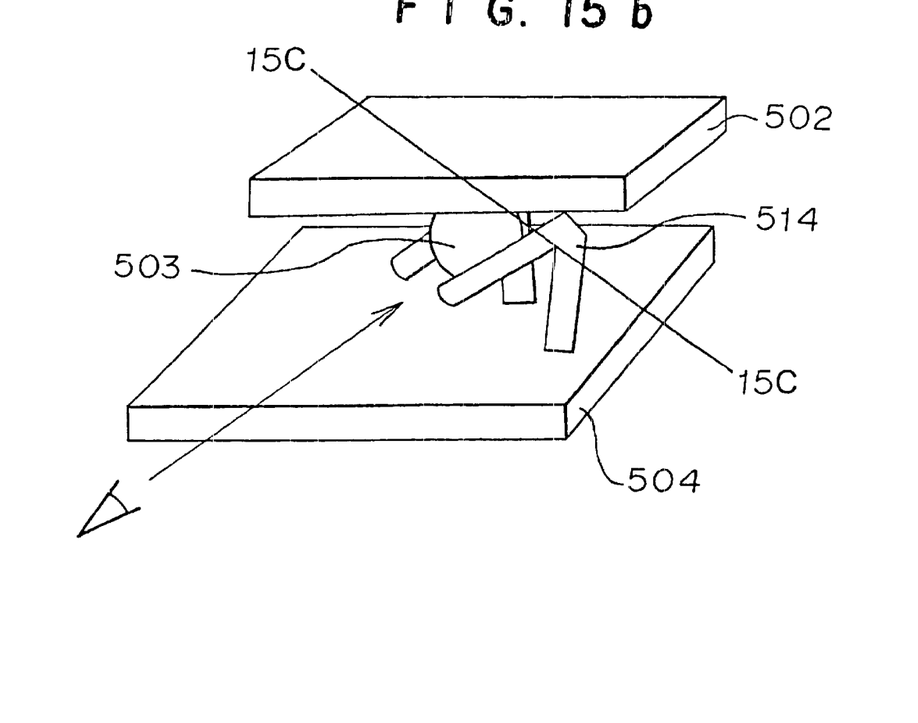
Figure 15C:
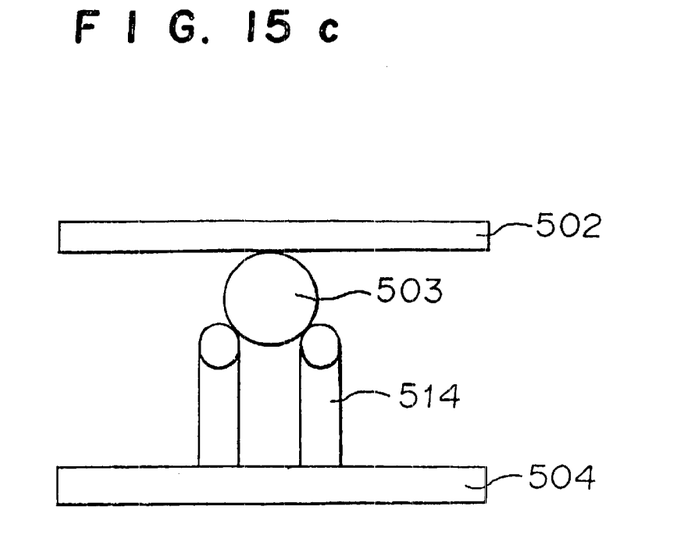

FIG. 15a illustrates a state that an electrode of a package is not in contact with contactors according to Embodiment 4. In FIGS. 15b and 15c, the contactor 514 in a V-like shape, made of a metal such as tungsten, are mounted on a DUT board 504 at a position corresponding to a solder ball 503 of a package 502. The DUT board 504 has a similar structure and a similar effect to those in Embodiment 3 other than two contactors 514 are required for one solder ball 503.

The DUT board has a structure enabling to separate and secure as in Embodiment 2.

Embodiment 5

Figure 16:
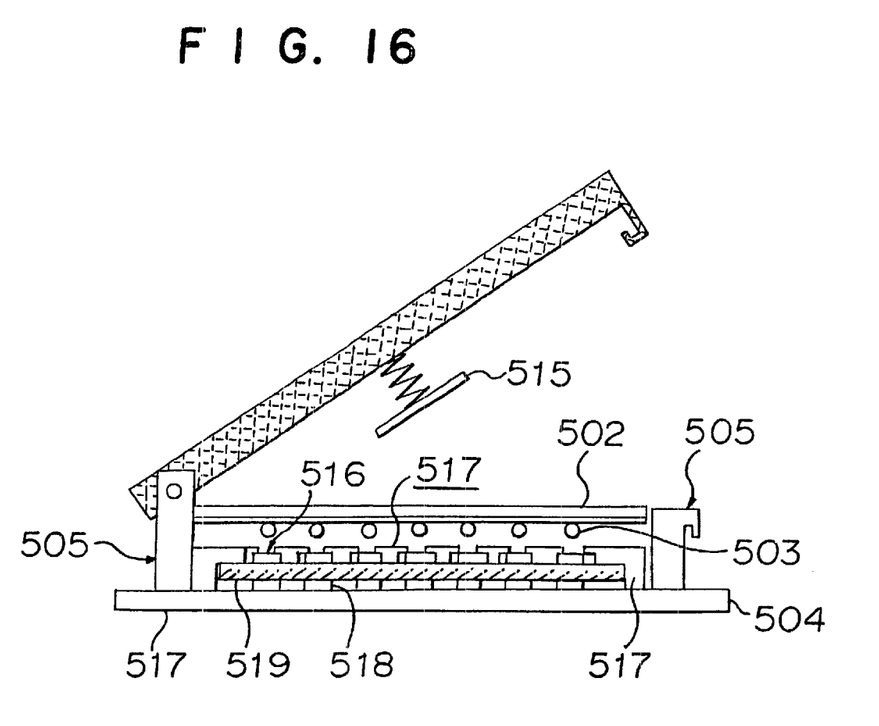
FIG. 16 is a cross-sectional view of a part of a DUT board, on which a package is mounted, according to Embodiment 5 *of the present invention;*

FIG. 16 is a cross-sectional view of a part of a DUT board, on which a package is mounted, according to Embodiment 5 of the present invention. In FIG. 16, a patterned contactor 518 is mounted on the DUT board 504. When a solder ball 503 is pushed toward the DUT board 504, the solder ball 503 is electrically connected to the contactor 518 through a metallic plate 516 and a conductive rubber 519. However, the conductive rubber 519 is mutually electrically insulated from other electrodes so that only a contactor 518 corresponding to a specific solder ball 503 is electrically connected to the conductive rubber. Further, an insulative guiding mechanism 517 is provided to fix the metallic plate 516 in an appropriate position.

Figure 17:
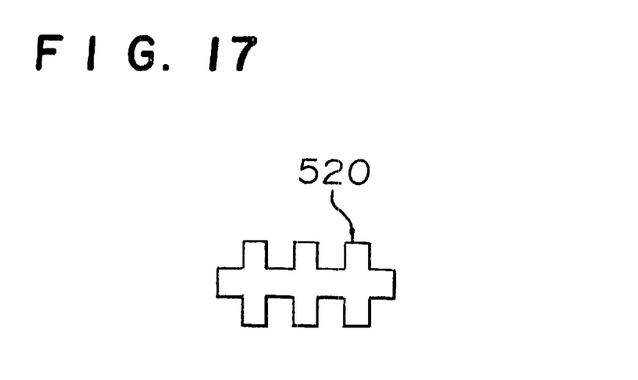
FIG. 17 is a cross-sectional view of a part of another contactor according to Embodiment 5 of the present invention.

FIG. 17 is a cross-sectional view of a part of another contactor according to Embodiment 5 of the present invention. In FIG. 17, the contactor 520 has recesses and protrusions. The protrusions are in contact with corresponding solder balls in the package via the conductive rubber to be electrically connected.

Further, in use of a metallic plate (not shown) having a cross-sectional structure with recesses and protrusions as in the contactor illustrated in FIG. 17, which metallic plate has a similar role to that in the metallic plate 516, contact force between the solder balls and the contactors through the conductive rubber is improved, whereby an electrical connection is assured.

As in the DUT board according to Embodiment 2, the DUT board according to Embodiment 5 has a structure enabling to separate and secure.

According to Embodiment 5, since the patterned electrode is used in the DUT board, the inductance L is further reduced. Further, since the conductive rubber is used, a minute pressure force between the electrode and the solder ball is realized. Further, since the metallic plate is in contact with the solder ball, an oxide of the solder ball, dust, and so on are not deposited on a surface of the conductive rubber, and even though these are deposited, it is possible to easily remove these by, for example, cleaning by alcohol.

The first advantage of the DUT board according to the present invention is that an anti-noise property is excellent and an operation is stable.

The second advantage of the DUT board according to the present invention is that the package is freely and easily mounted or dismounted.

The third advantage of the DUT board according to the present invention is that minute pressure force between the electrode and the contactor is obtainable and an electrical connection is secured.

The fourth advantage of the DUT board according to the present invention is that a time and a cost for repairing or exchanging are reduced and a cost for testing is reduced.

According to the fifth advantage of the testing method of the DUT board according to the present invention is that an anti-noise property is excellent and an operation test of a high-speed function becomes stable.

Obviously, numerous modifications and variations of the present invention are possible in right of the above teachings. It is therefore to be understood that within the scope of the appended claims, the invention may be practiced otherwise than as specifically described herein.

What is claimed is:

1. A device under test (DUT) board for testing a device having a package including an electrode, by being electrically connected with the electrode of the package, the DUT board comprising:

a contactor for direct contact with an electrode of a package upon mounting of the electrode on the DUT board, wherein said contactor is an elastic metallic plate having a U-shaped slit, a first part defined by the U-shaped slit, and a second part that is planar, the first part being bent with respect to the second part;

a guiding mechanism for maintaining a position of the electrode of the package; and a pushing mechanism for pressing the electrode of the package against said contactor.

2. The DUT board according to claim 1, wherein said first part is partly curved in cross-section.

3. The DUT board according to claim 1, wherein said first part is partly planar in cross-section.

4. The DUT board according to claim 1, including parallel lines located on a surface of said first part, along the slit.

5. The DUT board according to claim 1, including a dot-like protrusion located on a surface of said first part, along the slit.

6. A testing method using the DUT board according to claim 1, wherein the electrode of the package is freely mountable and dismountable on said contactor to reduce inductance.

7. A device under test (DUT) board for testing a device having a package including an electrode, by being electrically connected with the electrode of the package, the DUT board comprising:

a contactor for direct contact with an electrode of a package upon mounting of the electrode on the DUT board, wherein said contactor is a strip of an elastic metallic plate, the metallic plate having a slit in a longitudinal direction proximate a center of the strip, said metallic plate is bent in opposite directions adjacent the slit to form a V shape, in cross section, for receiving and contacting the electrode; and a slide movable away from and toward the contactor for opening and closing the V shape of said contactor.

8. The DUT board according to claim 7, further comprising a structure for separating the device from the DUT board and for securing the device to the DUT board.

9. A testing method using the DUT board according to claim 8, wherein the DUT board is freely mountable and dismountable to reduce inductance.

10. A testing method using the DUT board according to claim 7, wherein the electrode of the package is freely mountable and dismountable on said contactor to reduce inductance.

11. A device under test (DUT) board for testing a device having a package including an electrode, by being electrically connected with the electrode of the package, the DUT board comprising:

a contactor for direct contact with an electrode of a package upon mounting of the electrode on the DUT board, wherein said contactor is a strip of an elastic metallic plate, the metallic plate having a slit in a longitudinal direction proximate a center of the strip, said metallic plate is bent in opposite directions adjacent the slit to form a V shape, in cross section, for receiving and contacting the electrode;

a guiding mechanism for maintaining a position of the electrode of the package; and a pushing mechanism for pressing the electrode of the package against said contactor.

12. A device under test (DUT) board for testing a device having a package including an electrode by being electrically connected with the electrode of the package, the DUT board comprising:

a contactor having a patterned principal surface for connection to the electrode of the package upon mounting of the package on the DUT board;

a guiding mechanism for maintaining a position of the electrode of the package;

a pushing mechanism for pressing the electrode of the package against said contactor; and an electrically conductive rubber located between the electrode of the package and said contactor.

13. The DUT board according to claim 12, further comprising a structure for separating the device from the DUT board and for securing the device to the DUT board.

14. A testing method using the DUT board according to claim 13, wherein the DUT board is freely mountable and dismountable to reduce inductance.

15. A testing method using the DUT board according to claim 12, wherein the electrode of the package is freely mountable and dismountable on said contactor to reduce inductance.

16. The DUT board according to claim 12, wherein the electrically conductive rubber is electrically isolated from other electrodes of the package.

\* \* \* \* \*